United States Patent
Berry et al.

(10) Patent No.: US 8,799,846 B1
(45) Date of Patent: Aug. 5, 2014

(54) FACILITATING THE DESIGN OF A CLOCK GRID IN AN INTEGRATED CIRCUIT

(71) Applicant: International Business Machines Corporation, Armonk, NY (US)

(72) Inventors: Christopher J. Berry, Hudson, NY (US); Joseph N. Kozhaya, Morrisville, NC (US); Daniel R. Menard, Cary, NC (US); Susan R. Sanicky, San Jose, CA (US); Amanda C. Venton, Austin, TX (US); Paul G. Villarrubia, Austin, TX (US); Michael H. Wood, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/833,713

(22) Filed: Mar. 15, 2013

(51) Int. Cl.
*G06F 17/50* (2006.01)

(52) U.S. Cl.
CPC ........ *G06F 17/5072* (2013.01); *G06F 17/5077* (2013.01); *G06F 17/505* (2013.01)
USPC ........... 716/122; 716/123; 716/125; 716/129; 716/130; 716/131; 716/102; 703/16

(58) Field of Classification Search
CPC G06F 17/5072; G06F 17/5077; G06F 17/505
USPC ......... 716/122, 123, 125, 129, 130, 131, 102; 703/16
See application file for complete search history.

(56) References Cited

U.S. PATENT DOCUMENTS

| 5,656,963 | A  | * | 8/1997 | Masleid et al. ............... 327/297 |
| 6,247,166 | B1 | * | 6/2001 | Aipperspach et al. ........ 716/119 |
| 8,028,259 | B2 | * | 9/2011 | Phan Vogel ................... 716/111 |
| 2009/0210836 | A1 | * | 8/2009 | Phan Vogel ....................... 716/5 |
| 2013/0028400 | A1 | * | 1/2013 | Fix et al. ..................... 379/88.13 |

* cited by examiner

*Primary Examiner* — Phallaka Kik
(74) *Attorney, Agent, or Firm* — Cantor Colburn LLP; Margaret McNamara

(57) ABSTRACT

Embodiments of the disclosure relate to methods for facilitating the design of a clock grid in an integrated circuit. The method includes propagating a chip level virtual grid across a multi-level hierarchy of the integrated circuit and customizing the grid at each macro to create a customized virtual grid for each macro. The method further includes propagating the customized virtual grid for each of the plurality of macros to one of a plurality of units and customizing the chip level virtual grid at each of the plurality of units to create the customized virtual grid for each of the plurality of units. The method also includes propagating the customized virtual grid for each of the plurality of units to the chip level and combining the plurality of customized virtual grids to form the clock grid for the integrated circuit.

20 Claims, 5 Drawing Sheets

FACILITATING THE DESIGN OF A CLOCK GRID IN AN INTEGRATED CIRCUIT

BACKGROUND

The present disclosure relates to the design of clock grids, and more specifically, to methods and computer program products for facilitating the design of clock grids in integrated circuits.

Clock grids are commonly used for the distribution of clock signals in both high performance processor designs as well in designs for application specific integrated circuits (ASICs) with frequencies over one gigahertz (GHz). One component of clock grid design is the design of a virtual grid that is used to route the clock pins of leaf level clock buffers, which are typically located at a lowest level of hierarchy of an integrated circuit, to the global clock grid, which is typically located at the highest level of hierarchy of an integrated circuit. The virtual grid includes reserved metal tracks which are propagated and managed across the hierarchy of the integrated circuit by multiple designers that are each responsible for a different portion of the hierarchy, such as a macro level design, an integration level design, and a clock design. In general, the design process can be tedious, cumbersome and error-prone because of the need for several iterations between the designers at the different levels of hierarchy of the integrated circuit.

Currently, design of a lower level of an integrated circuit, or macro, of a hierarchy involves routing the clock signals from the input pins of leaf level clock buffers to a specific metal layer of the integrated circuit hierarchy independent of the ceiling layer of the macro. Accordingly, the virtual grid is managed as blockage which the macro designer needs to avoid and work around. For various reasons, it is not always possible for the macro designer to avoid or work around these blockages. For example, elements in the macro may conflict with the reserved virtual grid, the virtual grid may be overly pessimistic in areas of only a few or no clock sinks, or the virtual grid may be non-existent in areas where clock sinks exist. In these cases, the macro designers have to communicate to the integrators what modifications and customizations of the virtual grid are needed based on the macro design requirements. Multiple iterations and changes across the different hierarchical entities may be required to achieve a virtual grid that works around the specifics of the macro design.

SUMMARY

According to one embodiment, a method for facilitating the design of a clock grid in an integrated circuit includes generating a chip level virtual grid for the integrated circuit and propagating the chip level virtual grid across each level of the multi-level hierarchy. The method also includes customizing the chip level virtual grid at a lowest level of the multi-level hierarchy to create a customized virtual grid for the lowest level of the multi-level hierarchy and propagating the customized virtual grid for the lowest level of the multi-level hierarchy to a next level of the multi-level hierarchy. The method further includes customizing the chip level virtual grid at the next level of the multi-level hierarchy to create the customized virtual grid for the next level of the multi-level hierarchy and propagating the customized virtual grid for the next level of the multi-level hierarchy to a highest level of the multi-level hierarchy. The method also includes customizing the chip level virtual grid at the highest level of the multi-level hierarchy to create the customized virtual grid for the highest level of the multi-level hierarchy and combining the customized virtual grid for the lowest level of the multi-level hierarchy, the customized virtual grid for the next level of the multi-level hierarchy and the customized virtual grid for the highest level of the multi-level hierarchy to connect to a global clock grid for the integrated circuit.

According to another embodiment, a computer program product for facilitating the design of a clock grid in an integrated circuit, the computer program product including a tangible storage medium readable by a processing circuit and storing instructions for execution by the processing circuit for performing a method that includes generating a chip level virtual grid for the integrated circuit and propagating the chip level virtual grid across each level of the multi-level hierarchy. The method also includes customizing the chip level virtual grid at a lowest level of the multi-level hierarchy to create a customized virtual grid for the lowest level of the multi-level hierarchy and propagating the customized virtual grid for the lowest level of the multi-level hierarchy to a next level of the multi-level hierarchy. The method further includes customizing the chip level virtual grid at the next level of the multi-level hierarchy to create the customized virtual grid for the next level of the multi-level hierarchy and propagating the customized virtual grid for the next level of the multi-level hierarchy to a highest level of the multi-level hierarchy. The method also includes customizing the chip level virtual grid at the highest level of the multi-level hierarchy to create the customized virtual grid for the highest level of the multi-level hierarchy and combining the customized virtual grid for the lowest level of the multi-level hierarchy, the customized virtual grid for the next level of the multi-level hierarchy and the customized virtual grid for the highest level of the multi-level hierarchy to connect to a global clock grid for the integrated circuit.

According to a further embodiment, a method for facilitating the design of a clock grid in an integrated circuit having a multi-level hierarchy having a chip level having a plurality of units, each of the plurality of units having a plurality of macros includes generating a chip level virtual grid for the chip level of the integrated circuit. The method also includes propagating the chip level virtual grid across the multi-level hierarchy and customizing the chip level virtual grid at each of the plurality of macros to create a customized virtual grid for each macro. The method further includes propagating the customized virtual grid for each of the plurality of macros to a corresponding one of the plurality of units and customizing the chip level virtual grid at each of the plurality of units to create the customized virtual grid for each of the plurality of units. The method also includes propagating the customized virtual grid for each of the plurality of units to the chip level and combining the customized virtual grid for the plurality of macros and the customized virtual grid for the plurality of units to form the clock grid for the integrated circuit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In accordance with exemplary embodiments of the disclosure, a method for facilitating the design of clock grids in integrated circuits is provided. In exemplary embodiments, a bottom up method for design of clock grids is utilized to allow designers of lower level components to control the design of the virtual clock grid within the components that they are designing, rather than having the layout of the clock grid imposed by higher level chip designers.

Figure 1:
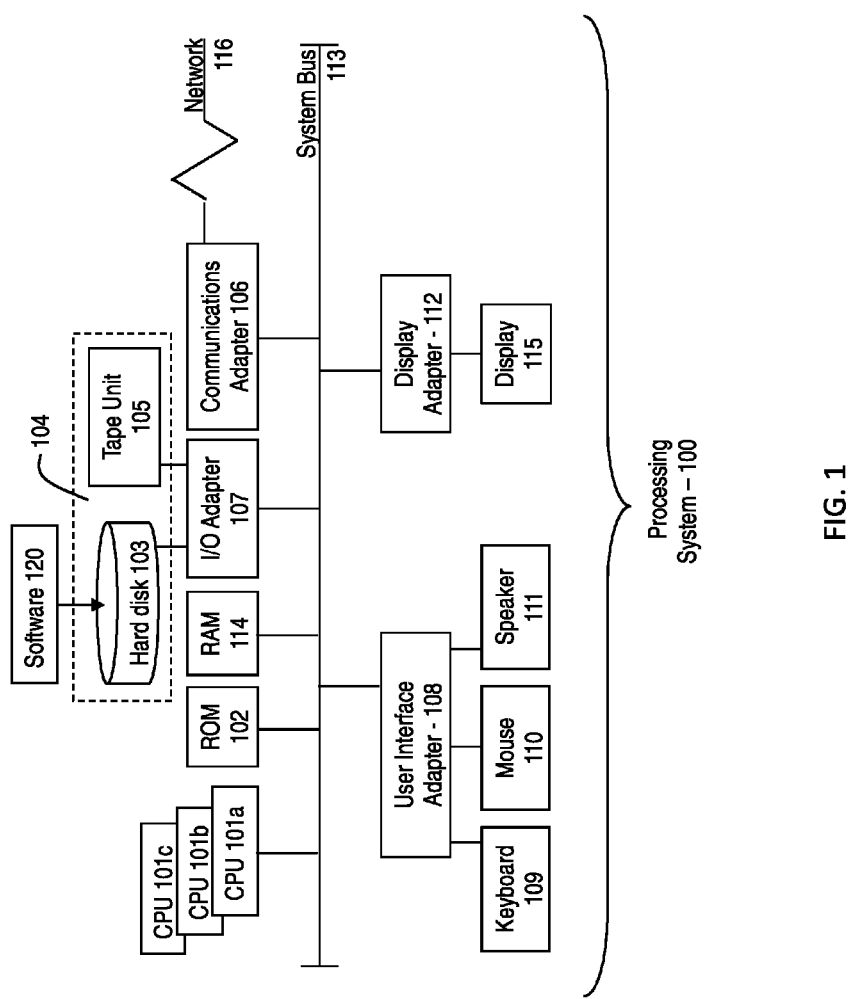
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Software 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system such as the AIX® operating system from IBM Corporation to coordinate the functions of the various components shown in FIG. 1.

Figure 2:
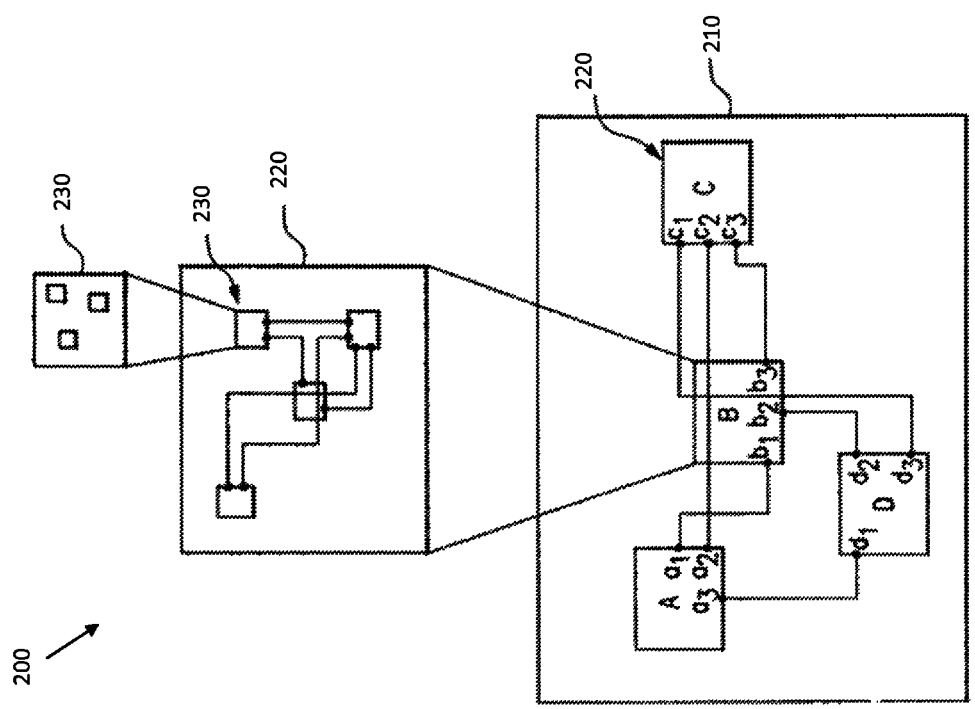
FIG. 2 illustrates a schematic layout of a integrated circuit in accordance with an exemplary embodiment.

Referring now to FIG. 2, a layout of an integrated circuit 200 in accordance with an exemplary embodiment is shown. As illustrated, the integrated circuit 200 includes a chip 210 that has been partitioned into logical partitions referred to as units 220 with each unit sized and assigned a non-overlapping region of the chip 210. Each unit 220, in turn can be further partitioned into smaller elements, referred to as macros 230, and each of the macros 230 can be further partitioned into smaller elements until there is a physical hierarchy of "n" levels, where "n" can be any integer but is typically limited to the number of levels required reach a manageable size design entity. Furthermore, each partition has a physical representation, which is referred to as an abstract. In exemplary embodiments, the abstract is an abstraction which contains a rectilinear polygon representing the physical size of the partition, plus terminal pins representing the physical connections to/from this partition. The wiring between partitions is referred to as global wiring, and the intra-partition wiring is referred to as local wiring.

Figure 3:
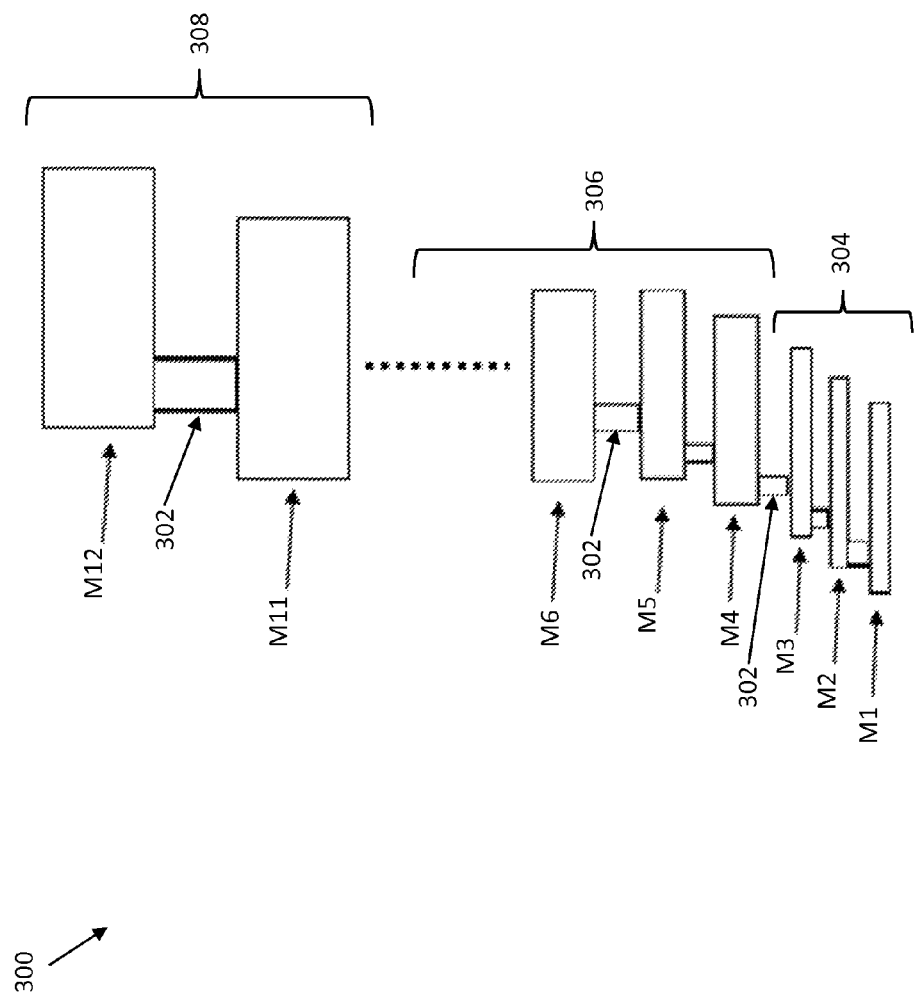
FIG. 3 illustrates the metal layers used to wire the virtual grid clock nets in accordance with an exemplary embodiment.

Referring now to FIG. 3, a block diagram illustrating the metal layers used to wire the virtual grid clock nets in accordance with an exemplary embodiment is shown. As illustrated in FIG. 2, the integrated circuit 200 partitions will be interconnected by wires on a plurality of metal layers (M1-M12). In exemplary embodiments, the metal layers may be separated in groups including lower layers 304, intermediate layers 306, and higher layers 308. The lower layers 304 may include the M1 layer, the M2 layer and the M3 layer. The local wiring within a macro (FIG. 2) may be wired on the lower layers 304. The intermediate layers 306 may include the M4-M10 layers. The local wiring within a unit (FIG. 2) may be wired on the lower layers 304 and the intermediate layers 306. The higher layers 308 may include the M11 layer and the M12 layer. The global clock grid may be wired on the higher layers 308. The global and local wiring within a chip (FIG. 2) may be wired on the lower layers 304, the intermediate layers 306, and the higher layers.

In exemplary embodiments, the designer of each level of the hierarchy of the integrated circuit is responsible for the design of the virtual grid on that level of hierarchy. In other words, every hierarchical entity has control over its virtual grid design and clock routing to its ceiling layer, which is the highest metal layer used by the hierarchical entity. In exemplary embodiments, the design process starts with a chip level virtual grid configured to meet delay specifications. In one embodiment, the chip level virtual grid may be defined by a clock design team. The chip level virtual grid is then propagated across the hierarchy to the lowest level macros. At every level of hierarchy, within each macro on that hierarchal level, the virtual grid is processed and customized as best suited for the specific design of each macro. For example, the virtual grid is configured to work around blockage conflicts with embedded elements and to provide enough tracks for routing the clock mesh net to meet the required delay specifications and to deliver design rule check (DRC) clean routes.

In exemplary embodiments, after the customized virtual grid for a hierarchal level is complete, it is then propagated to the next level of hierarchy where the virtual grid is further processed and customized. In exemplary embodiments, the parent entity, or higher hierarchal levels, can not customize the virtual grid of the child, or lower hierarchal levels. Rather, the parent entity, or higher hierarchal levels, can only customize its own virtual grid. The process iterates until the virtual clock grid is fully customized across all levels of hierarchy back to the top hierarchal level of the integrated circuit.

Figure 4:
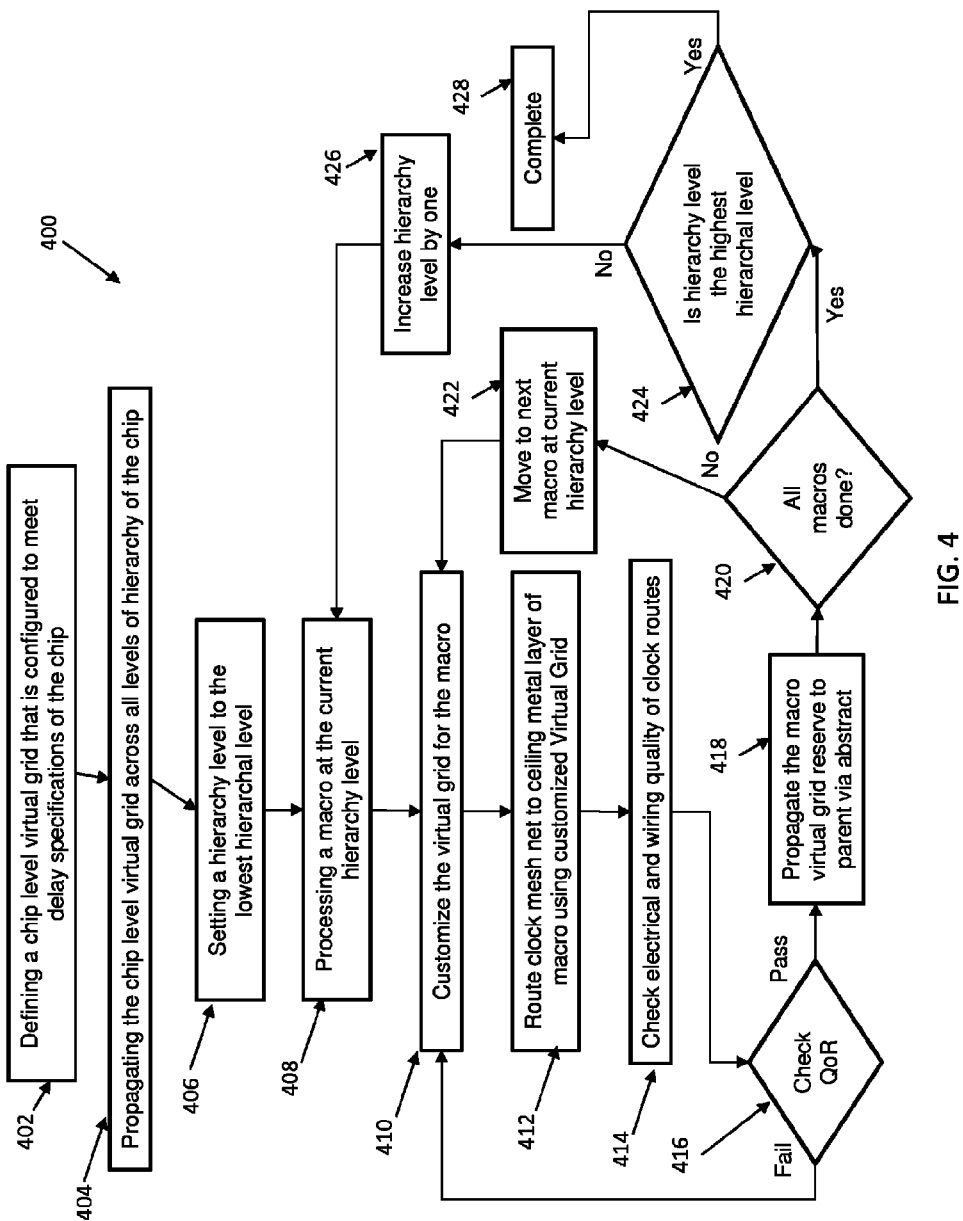
FIG. 4 illustrates a flow diagram of a method for facilitating the design of a clock grid in an integrated circuit in accordance with an exemplary embodiment.

Referring now to FIG. 4, a flow diagram of a method 400 for facilitating the design of a clock grid in an integrated circuit in accordance with an exemplary embodiment is shown. As illustrated at block 402, the method 400 begins by defining a chip level virtual grid that is configured to meet delay specifications of the integrated circuit. Next, as shown at block 404, the method 400 includes propagating the chip level virtual grid across all levels of hierarchy of the integrated circuit. As shown at block 406, the method 400 also includes setting a hierarchy level to the lowest hierarchal level of the integrated circuit. Next, a macro at the current hierarchy level is processed, as shown at block 408. As shown at block 410, the method 400 includes customizing the virtual grid for the macro being processed. Next, the method 400 includes routing a clock mesh net to a ceiling metal layer of the macro using the customized virtual grid, as shown at block 412. As shown at block 414, the method 400 includes checking the electrical and wiring quality of clock routes of the current hierarchy level. Next, as shown at decision block 416, the method 400 checks to the quality of the routes to ensure that all specification requirements have been achieved. If all specification requirements have been achieved, the method 400 proceeds to block 418. Otherwise, the method 400 returns to block 410.

Continuing with reference to FIG. 4, as shown at block 418, the method 400 includes passing the macro virtual grid reservation to the next hierarchy level, or parent, via an abstract. Next, as shown at decision block 416, the method 400 determines if all macros at the current hierarchy level have been processed and customized. If all macros at the current hierarchy level have not been processed and customized, the method 400 proceeds to block 422 and moves to next macro at the current hierarchy level. Otherwise, the method 400 proceeds to block 424 and determines if the current hierarchy level is the highest hierarchal level of the integrated circuit. If the current hierarchy level is not the highest hierarchal level of the integrated circuit, the method 400 proceeds to block 426 and increases hierarchy level by one. Otherwise, the method 400 proceeds to block 428 and concludes.

Although the method shown and described with reference to FIG. 4 illustrates processing the macros on each hierarchy level serially, it will be appreciated by one of ordinary skill in the art that multiple macros on a hierarchy level may be processed in parallel.

In exemplary embodiments, the designer of each macro is responsible for customizing the virtual grid of that macro in an optimal way for the specifics of that macro. The customization techniques used by the designer may include, but are not limited to avoiding blockages caused by embedded elements in the macro, removing reservations in areas with no clock sinks (no leaf level clock buffers), and adding reservations in areas with large number of clock sinks or in areas where no reservations exist but clock sinks exist. Once the designer has completed the customization of the virtual grid for the macro, an abstract of the macro with the customized virtual grid reservations at the perimeter of the macro is passed up to the parent. In exemplary embodiments, the customized virtual grids are passed up the hierarchy to the parent so the parent can utilize such reservations to provide access to other children which may exist close to the macro in question and which need to use the reservations of that macro to route in a manner to meet target delays.

In exemplary embodiments, the method for facilitating the design of a clock grid in an integrated circuit may improve the productivity of the designers of the integrated circuit. The initial chip level virtual grid provides all macro/unit/chip designers a starting point for their designs. By allowing macro designer to customize the virtual grid for their level of the integrated circuit in the most optimal way based on the specifics of the macro design, the churn and iterations across the hierarchy and the macro/unit/chip designers can be reduced. Furthermore, by having control of the virtual gird the macro designer can guarantee an adequate set of grid reservations to route the clock within the macro across multiple metal layers to its ceiling.

Figure 5B:
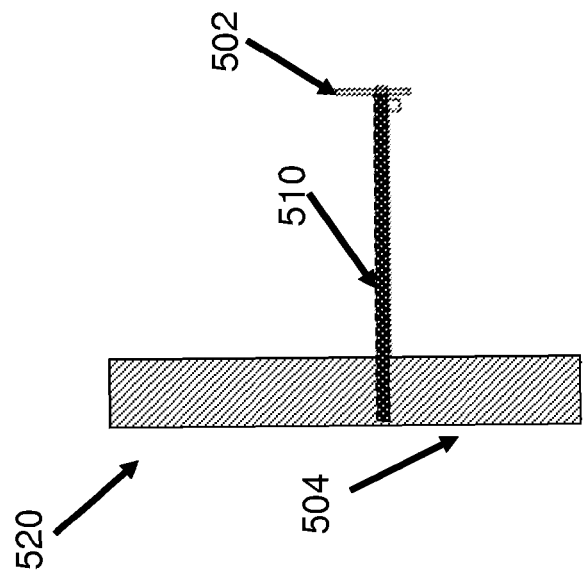
FIG. 5B illustrates a wiring diagram of a portion of a virtual grid designed in accordance with an exemplary embodiment.
Figure 5A:
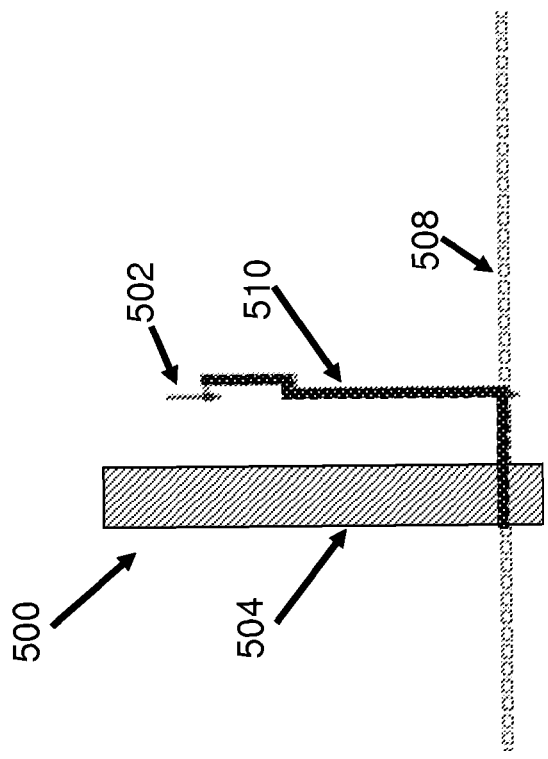
FIG. 5A illustrates a wiring diagram of a portion of a virtual grid designed in accordance with existing methodologies.

In exemplary embodiments, the method for facilitating the design of a clock grid in an integrated circuit allows for improvements in the routing efficiency of the design of the virtual grid for each macro. Since the macro designer is responsible for virtual grid customization, the macro designer can create the tracks in the most optimal locations to reduce blockages. In addition, the macro designer can delete any unnecessary reserved tracks, thereby minimizing wiring track usage. For example, FIG. 5A illustrates wiring diagram 500 for a portion of a virtual grid designed in accordance with existing methodologies and FIG. 5B illustrates wiring diagram 520 for a portion of a virtual grid designed in accordance with an exemplary embodiment of the method disclosed herein. As illustrated, the wiring diagrams 500, 520 provide for a wire 510 that is configured to connect a leaf clock buffer sink pin 502 to a clock grid 504. In the wiring diagram 500, the wire 510 extends from the leaf clock buffer sink pin 502 to an array of M5 pins 508 and from the array of M5 pins 508 to the clock grid 504. In contrast, the wiring diagram 520 allows for a direct connection between the leaf clock buffer sink pin 502 and the clock grid 504, resulting in a reducing of the wiring needed.

In exemplary embodiments, the method for facilitating the design of a clock grid in an integrated circuit allows for improvements in the power consumption efficiency of the design of the virtual grid for each macro. A significant amount of the clock grid power is used by the wires that connect the leaf level clock buffers to the global clock grid. By moving the ownership of routing the clock net to the macro up to its ceiling, the macro designer has more flexibility in reducing clock power by optimizing which wires get used for the routing.

In exemplary embodiments, the method for facilitating the design of a clock grid in an integrated circuit allows for improvements in the timing of the design of the virtual grid for each macro. By passing the task of clock routing to the macro's ceiling to the macro itself, it is possible to get more common path pessimism removal (CPPR) credit during timing of the integrated circuit. In current methodology, when clock routing within the macro's level of hierarchy is limited to an intermediate layer, such as the M5 layer, two leaf level clock buffers which may be driven by the same node on a higher metal layer but from different intermediate layer nodes do not get any CPPR credit. However, by passing the task of clock routing to the macro and clock routing to the macro's ceiling, CPPR credit can be leveraged to improve the design timing closure and reduce required padding which results in less area and less power.

In exemplary embodiments, the method for facilitating the design of a clock grid in an integrated circuit allows for guaranteed access for clock routing to all macros. For example, every macro passing a virtual grid reservation to its parent allows the parent to use the virtual grid reservation to provide access to a neighboring macro to connect to the global clock grid. In exemplary embodiments, the method for facilitating the design of a clock grid in an integrated circuit allows for improvements in clock shielding. For example, since the clock shields and the power grid are controlled by the same designer for the level of hierarchy, the designer can easily guarantee that the clock shields are tied to the power grid correctly. By contrast, in existing methodologies, the clock shields are controlled by the parent but the power grid is controlled by the child which makes the process of tying the shields to the power grid tedious and error prone.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for facilitating design of a clock grid in an integrated circuit having a multi-level hierarchy comprising:
   generating a chip level virtual grid for the integrated circuit;
   propagating the chip level virtual grid across each level of the multi-level hierarchy;
   customizing the chip level virtual grid at a lowest level of the multi-level hierarchy to create a customized virtual grid for the lowest level of the multi-level hierarchy;
   iteratively, beginning with the lowest level of the multi-level hierarchy and ending with a highest level of the multi-level hierarchy:
      propagating the customized virtual grid for a current level of the multi-level hierarchy to a next level of the multi-level hierarchy; and
      customizing the chip level virtual grid at the next level of the multi-level hierarchy to create the customized virtual grid for the next level of the multi-level hierarchy;
   combining, by a computer, the customized virtual grid for the lowest level of the multi-level hierarchy and the customized virtual grid for each next level of the multi-level hierarchy to connect to a global clock grid for the integrated circuit.

2. The method of claim 1, wherein the lowest level of the multi-level hierarchy comprises a plurality of macros and customizing the chip level virtual grid at the lowest level of the multi-level hierarchy to create the customized virtual grid for the lowest level of the multi-level hierarchy comprises customizing the chip level virtual grid for each of the plurality of macros.

3. The method of claim 2, wherein customizing the chip level virtual grid for each of the plurality of macros comprises avoiding blockages caused by embedded elements in each of the plurality of macros.

4. The method of claim 2, wherein customizing the chip level virtual grid for each of the plurality of macros comprises removing reservations in areas of each of the plurality of macros with no leaf level clock buffers.

5. The method of claim 2, wherein customizing the chip level virtual grid for each of the plurality of macros comprises adding reservations in areas of each of the plurality of macros with large number of leaf level clock buffers.

6. The method of claim 2, wherein the customized virtual grid for the lowest level of the multi-level hierarchy comprises a virtual grid reservation for each of the plurality of macros.

7. The method of claim 6, further comprising processing the customized virtual grid for the lowest level of the multi-level hierarchy by providing access for one of the plurality of macros to a neighboring macro to connect to the clock grid.

8. A computer program product for facilitating design of a clock grid in an integrated circuit having a multi-level hierarchy, the computer program product comprising:
   a non-transitory tangible storage medium readable by a processing circuit and storing instructions for execution by the processing circuit for performing a method comprising:
   generating a chip level virtual grid for the integrated circuit;
   propagating the chip level virtual grid across each level of the multi-level hierarchy;
   customizing the chip level virtual grid at a lowest level of the multi-level hierarchy to create a customized virtual grid for the lowest level of the multi-level hierarchy;
   iteratively, beginning with the lowest level of the multi-level hierarchy and ending with a highest level of the multi-level hierarchy:
      propagating the customized virtual grid for a current level of the multi-level hierarchy to a next level of the multi-level hierarchy; and
      customizing the chip level virtual grid at the next level of the multi-level hierarchy to create the customized virtual grid for the next level of the multi-level hierarchy;
   combining the customized virtual grid for the lowest level of the multi-level hierarchy and the customized virtual grid for each next level of the multi-level hierarchy to connect to a global clock grid for the integrated circuit.

9. The computer program product of claim 8, wherein the lowest level of the multi-level hierarchy comprises a plurality of macros and customizing the chip level virtual grid at the lowest level of the multi-level hierarchy to create the customized virtual grid for the lowest level of the multi-level hierarchy comprises customizing the chip level virtual grid for each of the plurality of macros.

10. The computer program product of claim 9, wherein customizing the chip level virtual grid for each of the plurality of macros comprises avoiding blockages caused by embedded elements in each of the plurality of macros.

11. The computer program product of claim 9, wherein customizing the chip level virtual grid for each of the plurality of macros comprises removing reservations in areas of each of the plurality of macros with no clock sinks.

12. The computer program product of claim 9, wherein customizing the chip level virtual grid for each of the plurality of macros comprises adding reservations in areas of each of the plurality of macros with large number of clock sinks.

13. The computer program product of claim 9, wherein the customized virtual grid for the lowest level of the multi-level hierarchy comprises a virtual grid reservation for each of the plurality of macros.

14. The computer program product of claim 13, further comprising processing the customized virtual grid for the lowest level of the multi-level hierarchy by providing access for one of the plurality of macros to a neighboring macro to connect to the clock grid.

15. A method for facilitating design of a clock grid in an integrated circuit having a multi-level hierarchy comprising a chip level having a plurality of units, each of the plurality of units having a plurality of macros:

generating a chip level virtual grid for the chip level of the integrated circuit;

propagating the chip level virtual grid across the multi-level hierarchy;

customizing the chip level virtual grid at each of the plurality of macros to create a customized virtual grid for each macro;

propagating the customized virtual grid for each of the plurality of macros to a corresponding one of the plurality of units;

customizing the chip level virtual grid at each of the plurality of units to create the customized virtual grid for each of the plurality of units;

propagating the customized virtual grid for each of the plurality of units to the chip level; and combining, by a computer, the customized virtual grid for the plurality of macros and the customized virtual grid for the plurality of units to form the clock grid for the integrated circuit.

16. The method of claim 15, wherein customizing the chip level virtual grid for each of the plurality of macros comprises removing reservations in areas of each of the plurality of macros with no clock sinks.

17. The method of claim 15, wherein customizing the chip level virtual grid for each of the plurality of macros comprises adding reservations in areas of each of the plurality of macros with large number of clock sinks.

18. The method of claim 15, wherein the customized virtual grid for the lowest level of the multi-level hierarchy comprises a virtual grid reservation for each of the plurality of macros.

19. The method of claim 15, the customized virtual grid for each of the plurality of macros comprises a virtual grid reservation for each of the plurality of macros.

20. The method of claim 19, further comprising processing the customized virtual grid for each of the plurality of macros by providing access for one of the plurality of macros to a neighboring macro to connect to the clock grid.

* * * * *